United States Patent
Hutzler et al.

(10) Patent No.: US 8,975,662 B2
(45) Date of Patent: *Mar. 10, 2015

(54) METHOD OF MANUFACTURING A SEMICONDUCTOR DEVICE USING AN IMPURITY SOURCE CONTAINING A METALLIC RECOMBINATION ELEMENT AND SEMICONDUCTOR DEVICE

(75) Inventors: Michael Hutzler, Villach (AT); Ralf Siemieniec, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/517,661

(22) Filed: Jun. 14, 2012

(65) Prior Publication Data

US 2013/0334565 A1 Dec. 19, 2013

(51) Int. Cl.
*H01L 29/66* (2006.01)

(52) U.S. Cl.
USPC .......... 257/139; 257/335; 257/339; 257/342; 438/270; 438/558

(58) Field of Classification Search
USPC .................. 257/139, 335, 339, 342, E29.262, 257/E21.141; 438/270, 558
See application file for complete search history.

(56) References Cited

U.S. PATENT DOCUMENTS

| | | | | | |
|---|---|---|---|---|---|
| 4,818,723 | A | * | 4/1989 | Yen | 438/647 |
| 4,966,868 | A | * | 10/1990 | Murali et al. | 438/232 |
| 5,700,722 | A | * | 12/1997 | Sumi | 438/649 |
| 6,177,351 | B1 | * | 1/2001 | Beratan et al. | 438/694 |
| 8,034,685 | B1 | * | 10/2011 | Venkatraman et al. | 438/270 |
| 8,558,308 | B1 | * | 10/2013 | Blank et al. | 257/335 |
| 2009/0108342 | A1 | * | 4/2009 | Wang et al. | 257/330 |

* cited by examiner

*Primary Examiner* — Fernando L Toledo
*Assistant Examiner* — Mohammed Shamsuzzaman
(74) *Attorney, Agent, or Firm* — Murphy, Bilak & Homiller, PLLC (57) ABSTRACT

Source zones of a first conductivity type and body zones of a second conductivity type are formed in a semiconductor die. The source zones directly adjoin a first surface of the semiconductor die. A dielectric layer adjoins the first surface. Polysilicon plugs extend through the dielectric layer and are electrically connected to the source and the body zones. An impurity source containing at least one metallic recombination element is provided in contact with deposited polycrystalline silicon material forming the polysilicon plugs and distant to the semiconductor die. Atoms of the metallic recombination element, for example platinum atoms, may be diffused out from the impurity source into the semiconductor die to reliably reduce the reverse recovery charge.

15 Claims, 11 Drawing Sheets

METHOD OF MANUFACTURING A SEMICONDUCTOR DEVICE USING AN IMPURITY SOURCE CONTAINING A METALLIC RECOMBINATION ELEMENT AND SEMICONDUCTOR DEVICE

BACKGROUND

In a forward-biased state of a body pn junction of a field effect transistor, charge carriers injected into a drift layer result in an excess charge carrier density that is drained off from the drift layer, when the pn junction switches to a reverse bias condition. The reverse recovery charge Qrr drained off from the drift layer contributes to the dynamic switching losses. Some transistor technologies provide introducing platinum impurities into the semiconductor die. The platinum impurities reduce charge carrier lifetime and, as a consequence, the reverse recovery charge. It is desirable to reduce the transistor reverse recovery charge for further field effect transistor designs.

SUMMARY

According to an embodiment, a method of manufacturing a semiconductor device includes providing, in a semiconductor die, source zones of a first conductivity type and body zones of a second conductivity type which is the opposite of the first conductivity type. The source zones adjoin a first surface of the semiconductor die. A polycrystalline silicon material is deposited to form polysilicon plugs that extend through a dielectric layer directly adjoining the first surface. The polysilicon plugs are electrically connected to the source and the body zones. An impurity source is provided in contact with the deposited polycrystalline silicon material and distant to the semiconductor die. The impurity source contains a metallic recombination element.

According to an embodiment, the impurity source is tempered to diffuse atoms of the metallic recombination element out from the impurity source into the semiconductor die.

According to another embodiment, a semiconductor device includes a field effect transistor structure including source zones of a first conductivity type and body zones of a second conductivity type which is the opposite of the first conductivity type. The source and the body zones are provided in a semiconductor die. The source zones adjoin a first surface of the semiconductor die. A dielectric layer directly adjoins the first surface. Polysilicon plugs extend through openings in the dielectric layer and are electrically connected to the source and the body zones. The polysilicon plugs include silicide crystallites in portions distant to the semiconductor die.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "nhu −" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
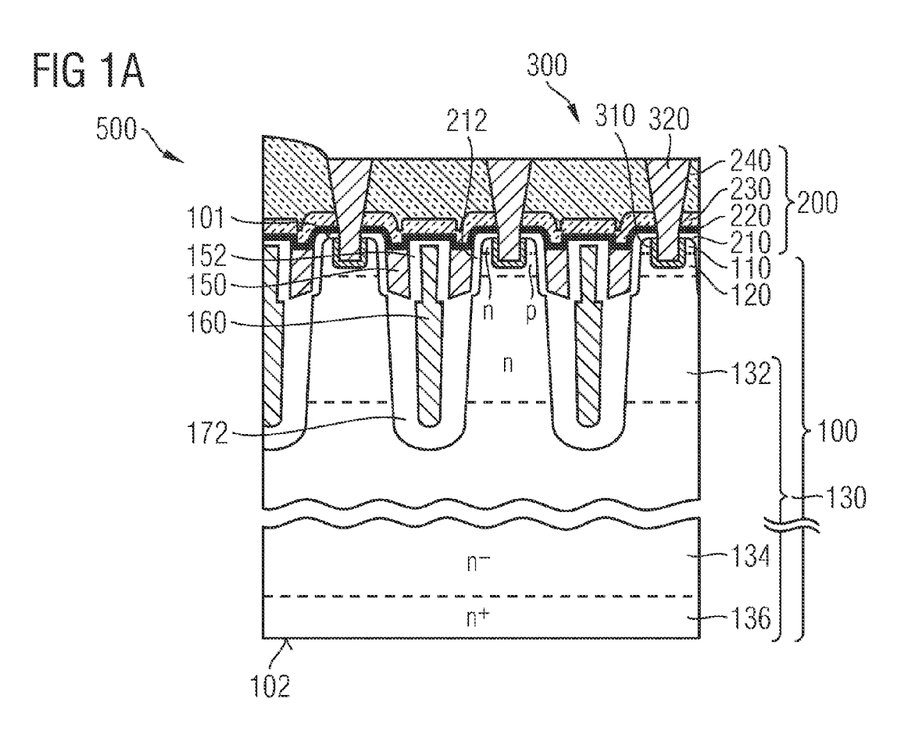
FIG. 1A is a schematic cross-sectional view of a semiconductor substrate for illustrating a method of manufacturing a semiconductor device according to an embodiment related to contact trenches, after providing polysilicon plugs.

FIG. 1A refers to a semiconductor substrate for the manufacturing of a plurality of semiconductor devices 500 each including a semiconductor die 100. The semiconductor substrate may be a wafer, for example a monocrystalline silicon wafer.

In a cell area of the semiconductor die 100, elements of one or more field effect transistor (FET) structures are provided that define the function of the semiconductor device 500, which may be, for example, an IGFET (insulated gate field effect transistor), for example an MOSFET (metal oxide semiconductor field effect transistor) in the usual meaning including FETs with metal and with non-metal gate electrodes, or an IGBT (insulated gate bipolar transistor). Each field effect transistor structure may include a plurality of transistor cells arranged in one or more cell arrays.

According to an embodiment the semiconductor device 500 may be a super-junction device with a field effect transistor structure including columns of both conductivity types alternatingly arranged and extending from a first surface 101 into the semiconductor die 100. According to the illustrated embodiment, the field effect transistor structure may include buried gate electrodes 150 and buried field electrodes 160 provided in gate trench structures extending from the first surface 101 into the semiconductor die 100. The buried field electrodes 160 extend deeper into the semiconductor die 100 than the buried gate electrodes 150. According to other embodiments, the field electrodes are absent.

A trench insulation structure 172 insulates the buried field electrode 160 from the semiconductor die 100. The trench insulation structure 172 may be provided from silicon oxide which may be thermally grown or deposited, for example using TEOS (tetraethylorthosilane) as precursor material, a silicate glass, silicon nitride, silicon oxynitride or any combination thereof, by way of example. An electrode insulation structure 152 insulates the buried field electrode 160 from the buried gate electrode 150. The electrode insulation structure 152 may be provided, for example, from silicon oxide which may be thermally grown or deposited, for example using TEOS (tetraethylorthosilane) as precursor material, silicate glass, silicon nitride or silicon oxynitride or any combination thereof. A gate dielectric 212 electrically insulates the buried gate electrode 150 from the semiconductor die 100. The gate dielectric 212 may be thermally grown or deposited semiconductor oxide, e.g. silicon oxide.

In the semiconductor die 100 source zones 110 of a first conductivity type and body zones 120 of a second conductivity type are formed, wherein the second conductivity type is the opposite of the first conductivity type. At least the source zones 110 directly adjoin the first surface 101 of the semiconductor die 100. According to the illustrated embodiment, only the source zones 110 directly adjoin the first surface 101 whereas the body zones 120 are disposed at a distance to the first surface 101 with the source zones 110 in-between. Sections of the semiconductor die 100 between the body zones 120 and a second surface 102 of the semiconductor die 100, which is opposite to the first surface 101, form a drain layer 130 of the first conductivity type.

The drain layer 130 may include two or more sub-layers which differ from each other by their dopant concentrations. By way of example, the drain layer 130 may include a highly doped substrate layer 136 close to or directly adjoining the second surface 102. The drain layer 130 may further include a drift layer 134 which may be a portion of an epitaxial layer and which may extend between the body zones 120 and the substrate layer 136, wherein a dopant concentration in the drift layer 134 may be more than ten times lower than in the substrate layer 136. According to the illustrated embodiment, the drain layer 130 further includes a compensation layer 132 between the body zones 120 and the drift layer 134, wherein in the compensation layer 132 the net dopant concentration exceeds that of the drift layer 134.

A dielectric layer 200 is formed in direct contact with the first surface 101. The dielectric layer 200 may include one or more sub-layers, for example an adhesion layer, a buffer layer and/or a diffusion barrier layer. According to an embodiment, the dielectric layer 200 includes a thermally grown silicon oxide layer 210 which may be formed contemporaneously with the gate dielectric 212. The dielectric layer 200 may further include a diffusion barrier layer 220, for example a silicon nitride or silicon oxynitride layer. A thin silicon oxide layer provided from deposited oxide, for example using TEOS as precursor material, or a silicate glass, for example undoped silicate glass, may form an adhesive or buffer layer 230. The dielectric layer 200 may further include a main dielectric layer 240 provided from BSG (boron silicate glass), PSG (phosphorus silicate glass) or BPSG (boron phosphorus silicate glass). Other embodiments may provide less or more sub-layers.

Openings are formed in the dielectric layer 200, for example using a photolithographically patterned photo resist layer as an etch mask. The openings expose central portions of the semiconductor die 100 at a distance to neighboring gate trench structures. According to an embodiment the openings expose both the source zones 110 and the body zones 120. In accordance with the illustrated embodiment, in the projection of the openings, contact trenches are etched into the semiconductor die 100 to expose the buried body zones 120. A metal may be deposited and tempered to form a metal silicide 310 along exposed surfaces of the semiconductor die 100, for example at the bottom and on the sidewalls of the contact trenches, if applicable. The metal may be titanium Ti, tantalum Ta, or tungsten W, by way of example.

A polycrystalline silicon material is deposited that fills the openings in the dielectric layer 200 to form polysilicon plugs 320 extending through the dielectric layer 200 and, if applicable, into the contact trenches. The polycrystalline silicon material may be in situ doped p-type or n-type polycrystalline silicon, for example polycrystalline silicon doped with boron B, phosphorus P or arsenic As. According to another embodiment the polycrystalline silicon material is deposited as intrinsic material. Outside the openings the deposited polycrystalline silicon material may form a polycrystalline layer.

According to an embodiment, an etch process removes the portions of the deposited polycrystalline silicon material outside the openings. According to another embodiment, the subsequent steps may be performed without removing the portions of the deposited polycrystalline silicon material forming the polysilicon layer. According to another embodiment the polysilicon plugs 320 may be recessed to below an exposed edge of the dielectric layer 200.

The metal silicide 310 electrically connects the polysilicon plugs 320 with the source zones 110 and the body zones 120. According to another embodiment, the polysilicon plugs 320 may directly adjoin the source zones 110 and the body zones 120. Further embodiments may provide contact structures from materials other than metal silicides, for example metal nitrides, e.g. TiN.

A further etch process may remove native oxide from exposed surfaces of the deposited polycrystalline silicon material or the polysilicon plugs 320. The etch process may use 1% hydrofluoric acid HF at an application time of about two minutes.

Figure 1B:
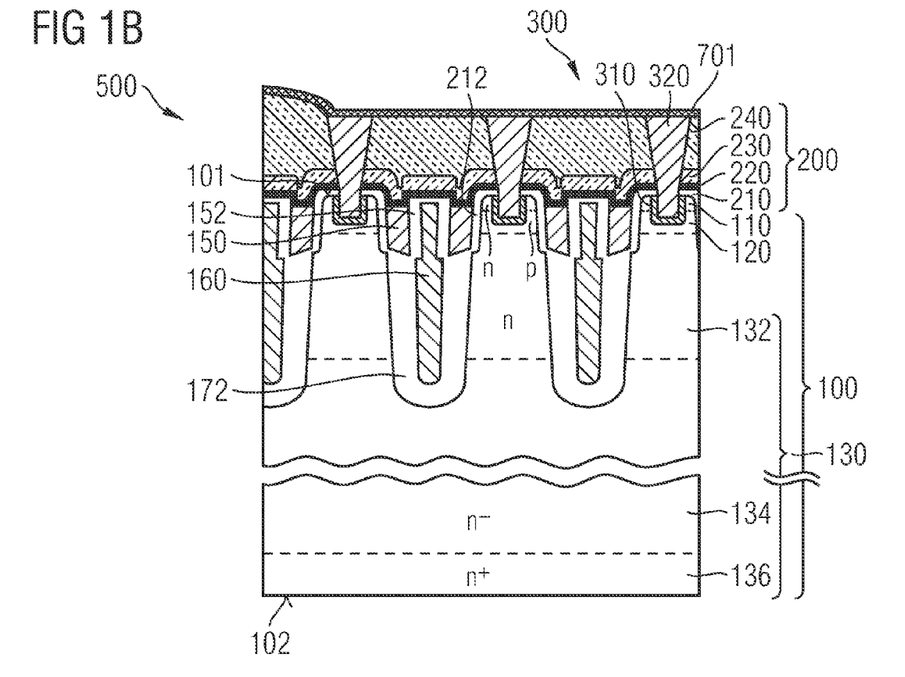
FIG. 1B is a schematic cross-sectional view of the semiconductor substrate of FIG. 1A after depositing a platinum layer.

As shown in FIG. 1B, closely following the etch process removing the native oxide, an impurity source is provided in contact with the deposited polycrystalline silicon material, for example on the polysilicon plugs 320.

The impurity source contains atoms of a metallic recombination element which may substitute silicon in a crystal lattice and which provides quantum mechanical states in the band gap of the semiconductor material of the semiconductor die, being effective as recombination centers for both holes and electrons in a silicon crystal. The metallic recombination element may be a heavy metal with suitable diffusion properties in a silicon crystal. By way of example, the metallic recombination element is platinum Pt, palladium Pd, vanadium V, iridium Ir or gold Au. According to an embodiment the metallic recombination element is platinum Pt.

The impurity source may be a solution containing the metallic recombination element, for example, a platinum containing solution like hexachloroplatinic acid $H_2PtCl_6$ solved in 1M hydrochloric acid HCl. The solution is brought into contact with the deposited polycrystalline silicon material. The solution may be spin-coated onto the semiconductor substrate. According to another embodiment, the semiconductor substrate is immerged into the solution.

In accordance with a further embodiment, platinum, vanadium, palladium, iridium and/or gold atom or ions may be implanted into the deposited polycrystalline silicon material. According to another embodiment at most five, for example one or two atomic layers of platinum, vanadium, palladium, iridium and/or gold are deposited onto the deposited polycrystalline silicon material. According to a further embodiment, a platinum, vanadium, palladium, iridium and/or gold containing layer is deposited and tempered such that the material of the deposited layer reacts with the silicon material of the deposited polycrystalline silicon material.

For example, platinum Pt may be deposited to form a platinum layer 701 covering the dielectric layer 200 and the exposed and cleaned surfaces of the polysilicon plugs 320. Platinum Pt may be deposited, for example, by using an evaporation process or a sputter process. The platinum layer 701 is tempered to control a silicidation process at a temperature between 450 and 500 degree Celsius, for example at about 470 degree Celsius.

Figure 1C:
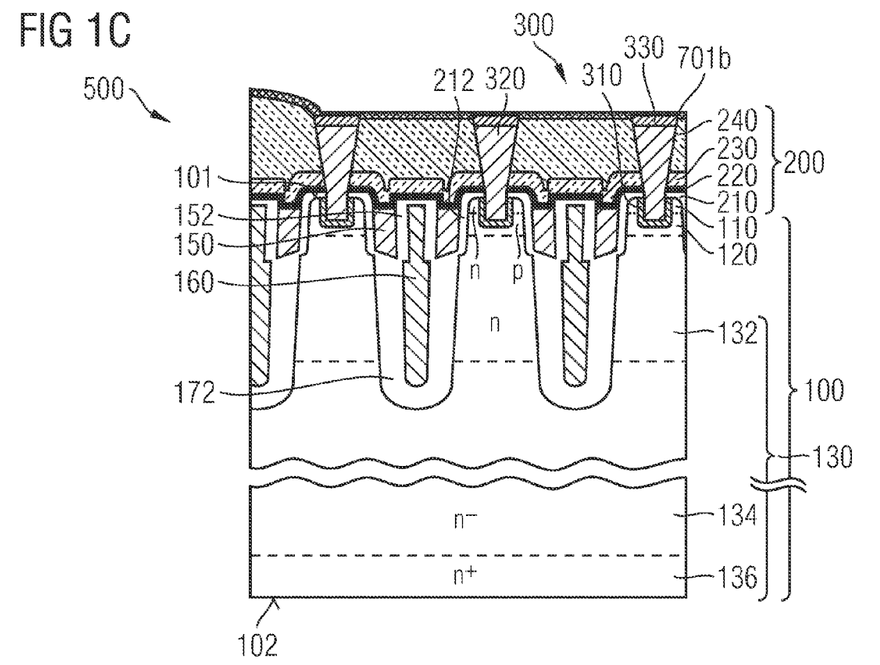
FIG. 1C is a schematic cross-sectional view of the semiconductor device of FIG. 1B after tempering the platinum layer to form layered platinum silicide structures.

FIG. 1C shows remnant portions 701b of the platinum layer 701 of FIG. 1B and layered platinum silicide structures providing platinum containing structures 330 on the polysilicon plugs 320. The remnant portions 701b may be removed, for example using aqua regia.

Figure 1D:
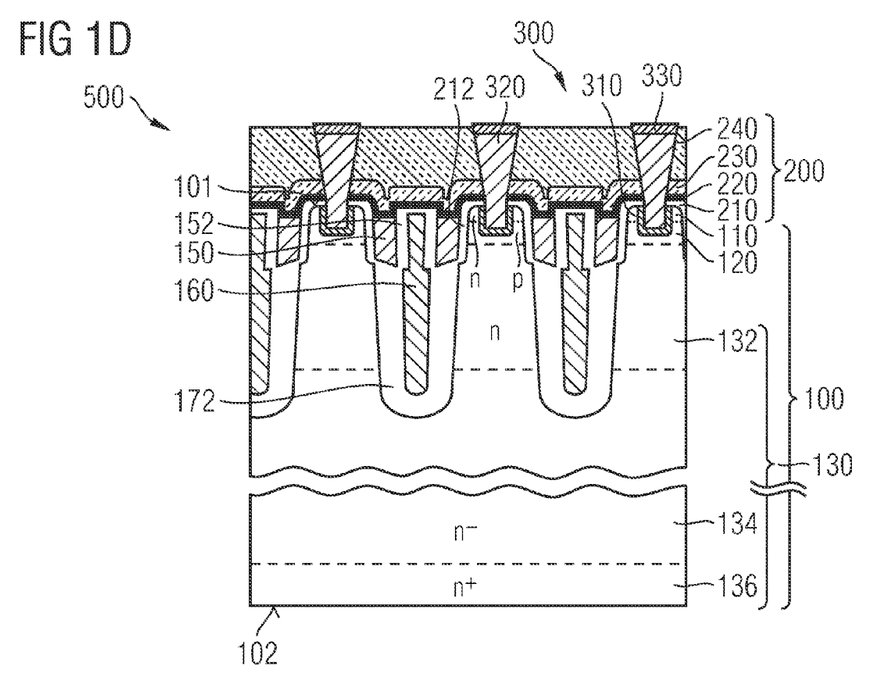
FIG. 1D is a schematic cross-sectional view of the semiconductor substrate of FIG. 1C after removing non-silicided portions of the platinum layer.

FIG. 1D shows the platinum containing structures 330 on the polysilicon plugs 320 after removal of the remnant portions of the platinum layer 701. According to another embodiment, less than five, for example one, atomic layer(s) of platinum Pt is(are) deposited, sections of which form the platinum containing structures 330. According to a further embodiment, platinum ions or atoms are implanted to form, in combination with the implanted regions of the polysilicon plugs 320, the platinum containing structures 330. The semiconductor substrate is tempered at a temperature of at least 750 degree Celsius, for example in a range from 850 to 900 degree Celsius, for example at 880 degree Celsius.

Figure 1E:
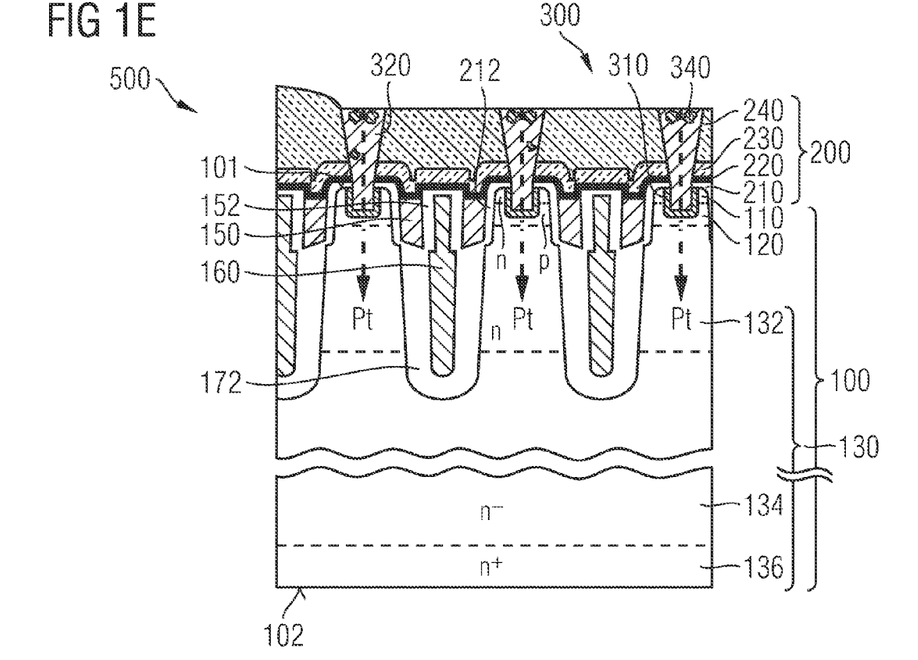
FIG. 1E is a schematic cross-sectional view of the semiconductor substrate of FIG. 1D during tempering to control a platinum diffusion.

As illustrated in FIG. 1E, platinum atoms diffuse out of the platinum containing structures 330 into the polysilicon plug 320 and through the metal silicides 310 into the semiconductor die 100. With the semiconductor material in the polysilicon plug 320, the diffused platinum atoms form platinum silicide crystallites 340, at least some of which are formed at a distance to the first surface 101, wherein the distance is, for example, at least 50 nanometer.

Figure 1F:
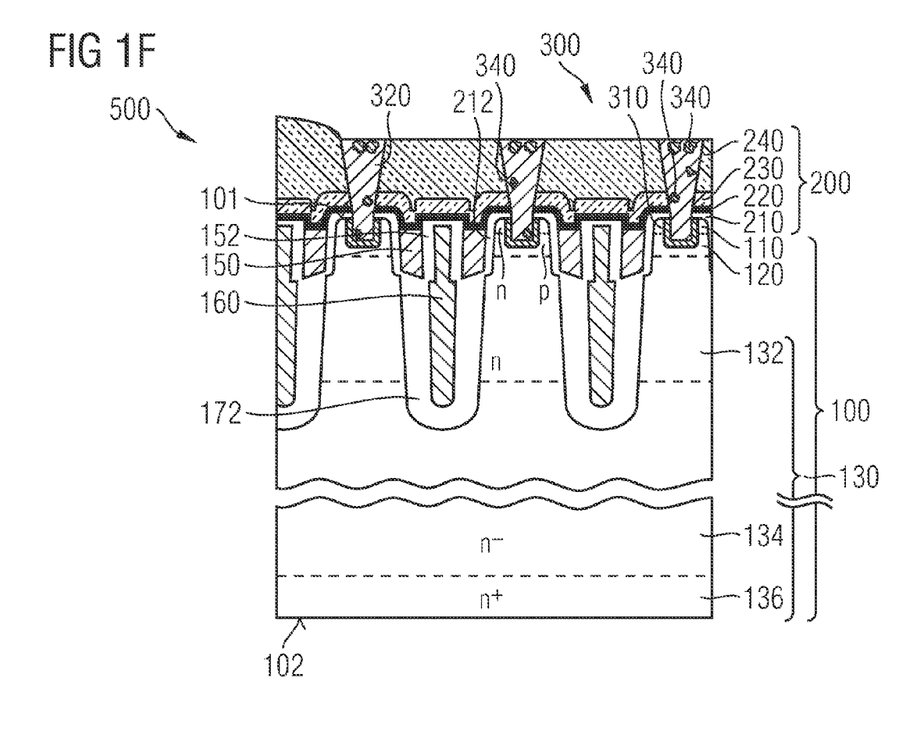
FIG. 1F is a schematic cross-sectional view of the semiconductor substrate of FIG. 1E after the tempering for platinum diffusion.

As illustrated in FIG. 1F, the platinum silicide crystallites 340 may be distributed over the complete height of the polysilicon plugs 320. Some of the platinum silicide crystallites 340 may be formed at the interface to the metal silicide 310. However, no platinum silicide crystallites can be observed within the semiconductor die 100. In the case of initially intrinsic polysilicon plugs 320, the n-type of p-type impurities may be introduced into the polysilicon plugs 320 after the tempering for controlling the outdiffusion of platinum. Other embodiments provide the diffusion of iridium Ir, Vanadium V, palladium Pd and/or gold Au in addition to or instead of platinum Pt.

Other than in conventional approaches, platinum silicide is not formed directly on the single crystalline semiconductor die 100. Even where a distance is narrow between contact regions accessible for the formation of platinum silicide on the one hand and the channel regions of the body zones 120, where a current flows through the body zones 120 in an on-state, platinum silicide is not formed close to the channel region. Platinum silicide is also not formed in the contact regions of the source zones 110 and body zones 120. As a result, the platinum diffusion does not strongly affect the on-state characteristics of the field effect transistor structure. Growing the platinum silicide on top of the polysilicon plugs 320 allows for introducing platinum into the semiconductor die 100 from a wafer front side where most of the lithographic, etch and depositing processes are performed without adverse effects on the transistor performance. Since platinum is deposited only after contact implants and the metal silicide formation in the contact regions and, if applicable, even after the deposition of a pad oxide in an edge area surrounding the cell area, less manufacturing apparatuses must be approved for platinum Pt containing substrates such that process control complexity and manufacturing costs can be kept low.

Figure 2:
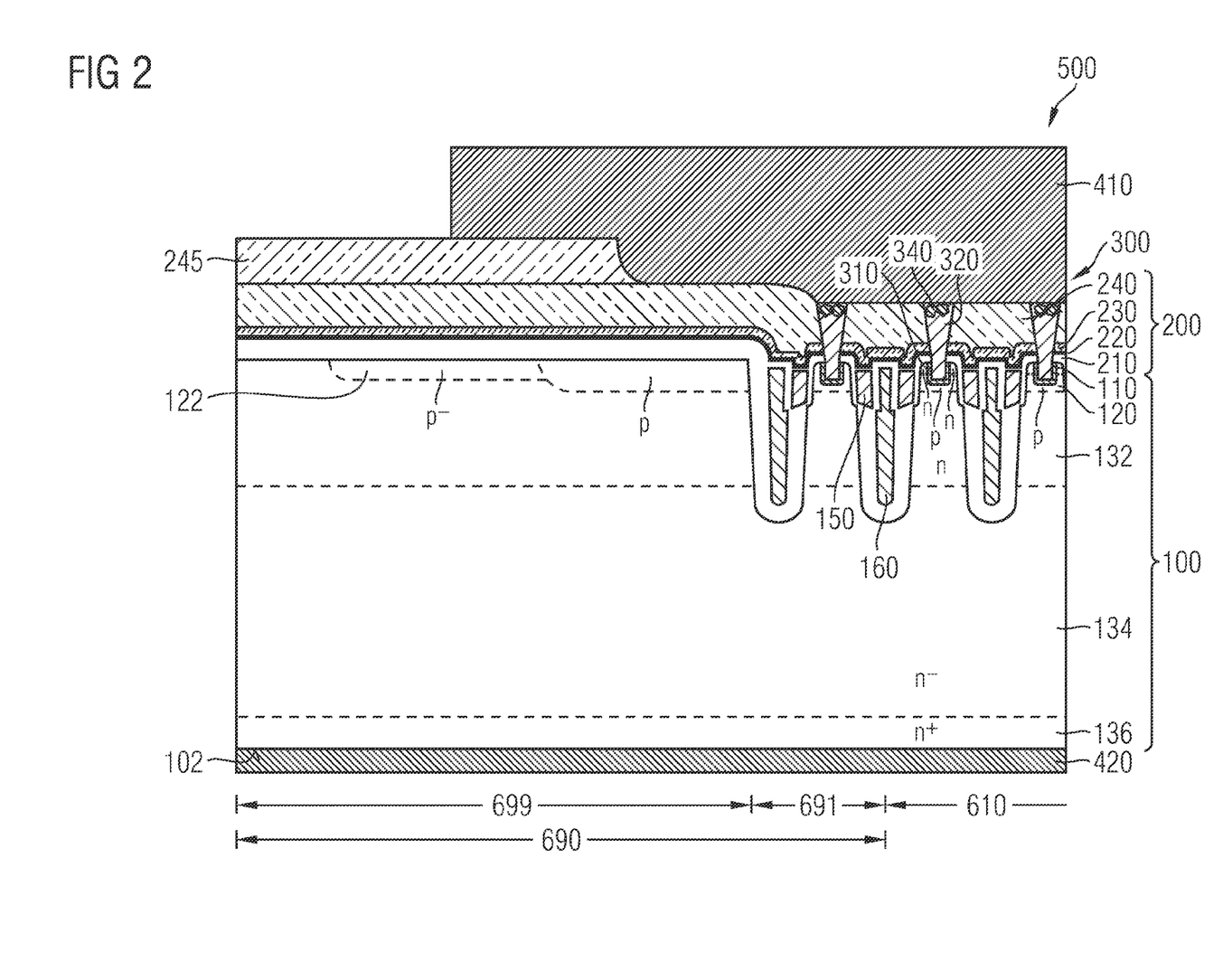
FIG. 2 is a schematic cross-sectional view of a portion of a semiconductor device according to an embodiment related to contact trenches.

FIG. 2 shows a portion of a semiconductor device 500. A cell area 610 includes field effect transistor structures formed in a semiconductor die 100 with a first surface 101 and a second surface 102 opposing the first surface 101. Gate trench structures extend from the first surface 101 into the semiconductor die 100. In the gate trench structures, gate electrodes 150 and field electrodes 160 are formed, for example from highly doped polycrystalline silicon. The field electrodes 160 extend deeper into the semiconductor die 100 than the gate electrodes 150. The buried gate electrodes 150 may be electrically coupled to a gate terminal of the semiconductor device 500 or to an output terminal of a gate driver circuit integrated in the semiconductor device 500. The buried field electrode 160 is not electrically coupled to the gate electrode. The buried field electrodes 160 may be without connection to other elements of the semiconductor device 500 and may float. According to other embodiments, the buried field electrodes 160 may be electrically coupled to a source electrode, an output terminal of a driver circuit integrated in a semiconductor device 500 or an input terminal of the semiconductor device 500.

Trench insulation structures 172 insulate the buried field electrodes 160 from the semiconductor die 100. The trench insulation structures 172 may be provided from silicon oxide which may be thermally grown or deposited, for example using TEOS (tetraethylorthosilane) as precursor material, a silicate glass, silicon nitride, silicon oxynitride or any combination thereof, by way of example. Electrode insulation structures 152 insulate the buried field electrodes 160 from the buried gate electrodes 150. The electrode insulation structures 152 may be provided, for example, from silicon oxide which may be thermally grown or deposited, for example using TEOS (tetraethylorthosilane) as precursor material, silicate glass, silicon nitride, silicon oxynitride or any combination thereof. A gate dielectric 212 electrically insulates the buried gate electrode 150 from the semiconductor die 100. The gate dielectric 212 may be thermally grown or deposited semiconductor oxide, e.g. silicon oxide.

The semiconductor die 100 provides source zones 110 of a first conductivity type and body zones 120 of a second conductivity type, which is the opposite of the first conductivity type. According to the illustrated embodiment, only the source zones 110 directly adjoin the first surface 101 whereas the body zones 120 are disposed at a distance to the first surface 101 with the source zones 110 in-between. Sections of the semiconductor die 100 between the body zones 120 and a second surface 102 of the semiconductor die 100, which is opposite to the first surface 101, form a drain layer 130 of the first conductivity type.

The drain layer 130 may include two or more sub-layers which differ from each other by their dopant concentration. By way of example, the drain layer 130 may include a highly doped substrate layer 136 close to or directly adjoining the second surface 102. The net dopant concentration in the substrate layer 136 may be in the range from $10^{17}$ cm$^{-3}$ to $10^{20}$ cm$^{-3}$, for example in the range from $10^{19}$ cm$^{-3}$ to $10^{20}$ cm$^{-3}$. The drain layer 130 may further include a lower doped drift layer 134 which may extend between the body zones 120 and the substrate layer 136. A dopant concentration in the drift layer 134 may be, for example, between $5\times10^{14}$ and $10^{17}$ cm$^{-3}$. According to the illustrated embodiment, the drain layer 130 further includes a compensation layer 132 between the body zones 120 and the drift layer 134, wherein in the compensation layer 132 the dopant concentration is higher than in the drift layer 134. The dopant concentrations in the compensation layer 132 and the drift layer 134 may or may not be a function of the distance to the first surface 101. For example, the dopant concentration may decrease towards the second surface 102 in the compensation layer 132 and at least a portion of the drift layer 134. According to other embodiments a field stop layer having a dopant concentrations higher than in the drift layer 134 and lower than in the substrate layer 136 may be formed between the drift layer 134 and the substrate layer 136.

The body zones 120 and the gate electrodes 150 are arranged at approximately the same distance to the first surface 101. The distance of a first edge of the body zones 120 oriented to the first surface 101 is approximately the same as the distance of a first edge of the gate electrodes 150 to the first surface 101. A distance between the first surface 101 and a second edge of the body zones 120 oriented to the second surface 102 is approximately the same as the distance between the first surface 101 and the second edge of the gate electrodes 150 oriented to the second surface 102.

The illustrated embodiment refers to enhancement-type field effect transistor structures with the first conductivity type being the n-type and the second conductivity type being the p-type. According to other embodiments, the first conductivity type is the p-type and the second conductivity type is the n-type. Further embodiments may refer to depletion-type field effect transistor structures or to IGBTs providing a collector layer of the second conductivity type between the doped layer 130 and the second surface 102. In an off state, the pn-junctions of the body zones 120 inhibit a current flow between the source zones 110 and the drain layer 130. In an on state, a positive potential applied to the gate electrodes 150 controls the charge carrier distribution in a channel portion of the body zones 120 along the gate dielectrics 212 to form an n-type conductive channel between the source zones 110 and the drain layer 130.

A dielectric layer 200 is formed in direct contact with the first surface 101. The dielectric layer 200 may include one or more sub-layers, for example an adhesion layer, a buffer layer and/or a diffusion barrier layer. According to an embodiment, the dielectric layer 200 includes a thermally grown silicon oxide layer 210 which may be formed contemporaneously with the gate dielectric 212. The dielectric layer 200 may further include a diffusion barrier layer 220, for example a silicon nitride or silicon oxynitride layer. A thin silicon oxide layer provided from deposited oxide, for example using TEOS as precursor material, or a silicate glass, for example undoped silicate glass, may form an adhesive or buffer layer 230. The dielectric layer 200 may further include a main dielectric layer 240 provided from BSG (boron silicate glass), PSG (phosphorus silicate glass) or BPSG (boron phosphorus silicate glass). Other embodiments may provide less or more sub-layers.

The semiconductor device 500 further includes a first metal layer 410 which the dielectric layer 200 separates from the semiconductor die 100. A second metal layer 420 directly adjoins the second surface 102. The first metal layer 410 may provide a source electrode and the second metal layer 420 may provide a drain electrode of the semiconductor device 500. The first and second metal layers 410, 420 may consist of or contain, as main constituent(s), aluminum Al, copper Cu or alloys of aluminum or copper, for example AlSi, AlCu, or AlSiCu. According to other embodiments, the first and/or second metal layers 410, 420 may contain, as main constituents, nickel Ni, titanium Ti, silver Ag, gold Au, platinum Pt and/or palladium Pd. For example, at least one of the metal layers 410, 420 may include two or more sub-layers, each sub-layer containing one or more of Ni, Ti, Ag, Au, Pt, Pd as main constituent(s) and/or alloys therefrom.

Contact plugs 300 electrically connect the first metal layer 410 with the source and the body zones 110, 120. The contact plugs 300 may include a metal silicide 310, wherein the metal may be titanium Ti, tantalum Ta or tungsten W, by way of example. The metal silicide 310 is formed along the interface between the contact plugs 300 and the semiconductor die 100. Each contact plug 300 further includes a polysilicon plug 320 provided from highly doped polycrystalline silicon. The contact plugs 300 further include silicide crystallites 340, for example platinum silicide crystallites, resulting from the out diffusion of a metallic recombination element such as platinum Pt from an impurity source, for example a platinum containing structure which may be completely or partly absent in the finalized semiconductor device 500.

According to another embodiment the contact plugs 300 may include a platinum containing structure other than platinum silicide crystallites at a distance to the semiconductor die 100, the distance being greater than 50 nanometer.

In an edge area 690 surrounding the cell area 610 an edge termination construction defines the reverse breakdown voltage of the edge area 690 which should be greater than the reverse breakdown voltage of the cell area 610, wherein the reverse breakdown voltage is the minimum applied voltage that causes the semiconductor device 500 to break down in the reverse mode. In an inner portion 691 of the edge area 690 oriented to the cell area 610 further gate trench structures extending from the first surface 101 into the semiconductor die 100 do not include operable gate electrodes. Source zones 110 may be absent in the inner portion 691. In an outer portion 699 of the edge area 690 oriented to an edge of the semiconductor die 100, a low doped junction termination extension 122 of the second conductivity type may be provided as an extension of the body zones 120 into the edge area 690 to flatten equipotential lines and to alleviate local field strength maxima in the edge area 690. The first metal layer 410 may extend into the edge area 690 and an insulator layer 245, e.g. a glass material, may be provided between the first metal layer 410 and the semiconductor die 100.

When the body pn junction between the body zone 120 and the drain layer 130 is forward biased, charge carriers injected into the drift layer 134 diffuse into the edge area 690. When the body pn junction is switched from the forward biased state to the reverse biased state, the charge carriers diffused into the edge area 690 have to be drained off by the field effect transistor structures disposed directly adjoining the edge area 690. The charge carriers drained off from the edge area 690 add to the charge carriers which must be drained off from the cell area 610 and may significantly increase current densities in a border portion of the cell area 610 adjoining the edge area 690. Since the current densities increase with increasing di/dt, at a sufficiently high di/dt, the increased current densities result in locally increased temperatures in the border portion. Shortening charge carrier lifetime results in a lower charge carrier diffusion length such that the portion of the edge area 690 into which charge carriers diffuse in the forward-biased state is significantly reduced and less charge carriers have to be drained off. As a result, the semiconductor device 500 becomes more robust.

Figure 3A:
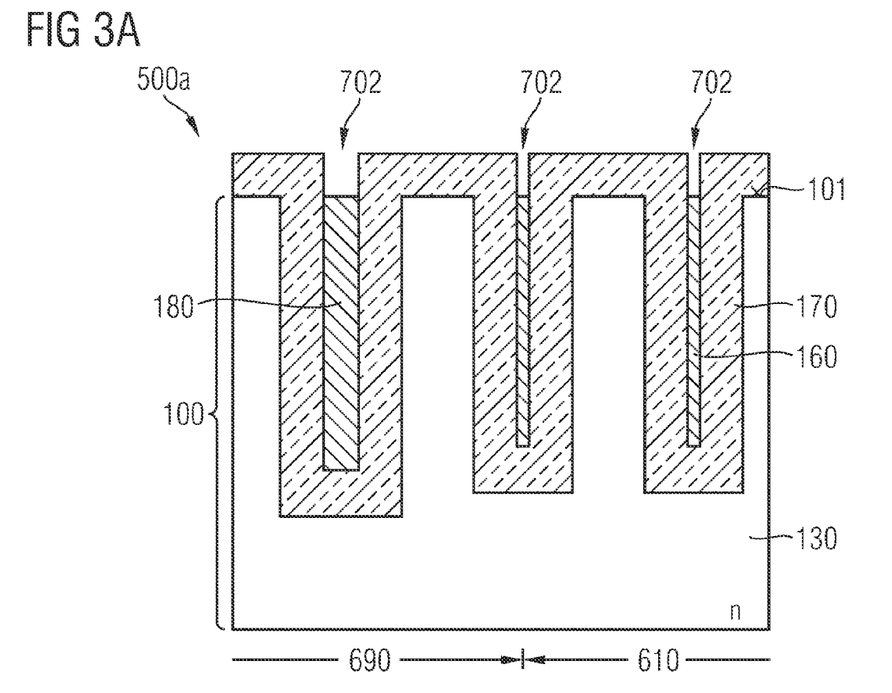
FIG. 3A is a schematic cross-sectional view of a semiconductor substrate during manufacturing of a semiconductor device in accordance with an embodiment related to body zones adjoining a first surface of a semiconductor die after providing field electrodes.

FIG. 3A refers to a semiconductor substrate 500a from which a plurality of semiconductor devices are produced. Each semiconductor device is based on a semiconductor die 100 which is a portion of the semiconductor substrate 500a. The semiconductor substrate 500a is a wafer, for example a monocrystalline silicon wafer. Outside the illustrated portion the semiconductor substrate 500a may include further doped and undoped sections, epitaxial semiconductor layers and previously fabricated insulating structures.

The semiconductor die 100 provides a doped layer 130 of a first conductivity type. Trenches are introduced from a first surface 101 into the semiconductor die 100 in both a cell area 610 and an edge area 690 surrounding the cell area 610. The trenches may have the same shape and dimensions in the cell area 610 and the edge area 690. According to the illustrated embodiment, the trenches formed in the edge area 690 are deeper and wider than the trenches formed in the cell area 610. The trenches may have approximately vertical sidewalls and may have a depth ranging from 5 to 25 micrometer, for example from 8 to 15 micrometer. According to an embodiment the depth of the trenches is 9 micrometer. Within the cell area 610 the trenches may be evenly spaced at a pitch from about 1 micrometer to 10 micrometer, for example from 3.5 to 4.5 micrometer. The width of the trenches may range from 0.5 to 5 micrometer, for example from 2.5 to 3.5 micrometer.

Trench insulation structures 170 line the trenches in both the cell area 610 and the edge area 690. The trench insulation structures 170 may be formed from a deposited silicon oxide. The thickness of the trench insulation structures 170 may range from 0.8 micrometer to 2.0 micrometer, for example from 1.0 to 1.4 micrometer.

A conductive material, for example highly doped polycrystalline silicon is deposited to fill the trenches. The deposited conductive material is etched back to form field electrodes 160 in the trenches of the cell area 610 and further field electrodes 180 in the trenches of the edge area 690. The conductive material is etched back such that exposed edges of the field electrodes 160, 180 are approximately flush with the first surface 101. Gaps 702 result above the field electrodes 160, 180. A sacrificial material may be deposited to fill the gaps 702 of FIG. 3A.

Figure 3B:
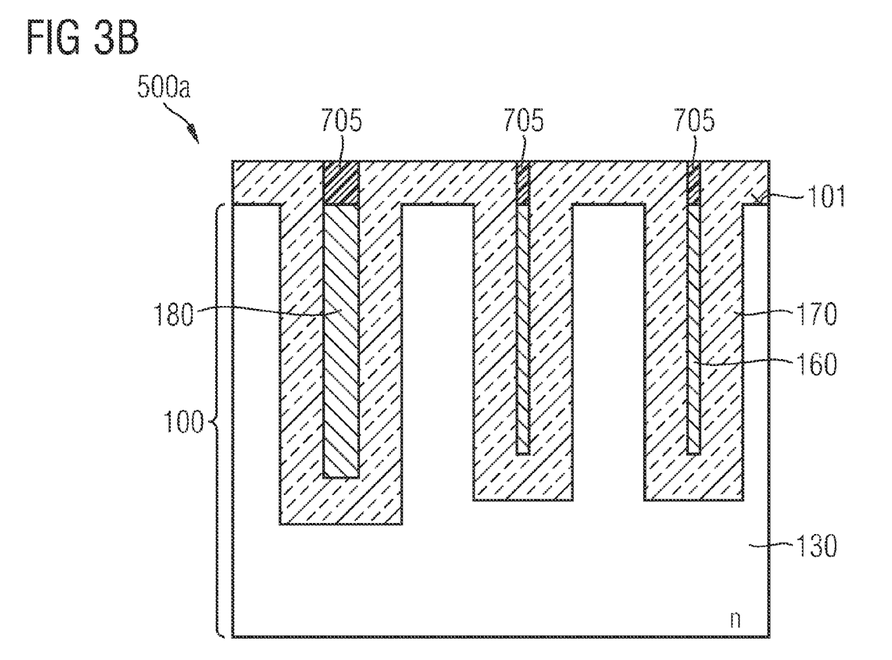
FIG. 3B is a cross-sectional view of the semiconductor substrate of FIG. 3A after providing auxiliary fills.

FIG. 3B shows the gaps 702 of FIG. 3A filled with the sacrificial material, which may be a photo resist, carbon, or any other material having material properties differing from the conductive material of the field electrodes 160, 180. The semiconductor substrate 500a may be planarized at least up to the first surface 101 wherein trench depth variations may be compensated.

Figure 3C:
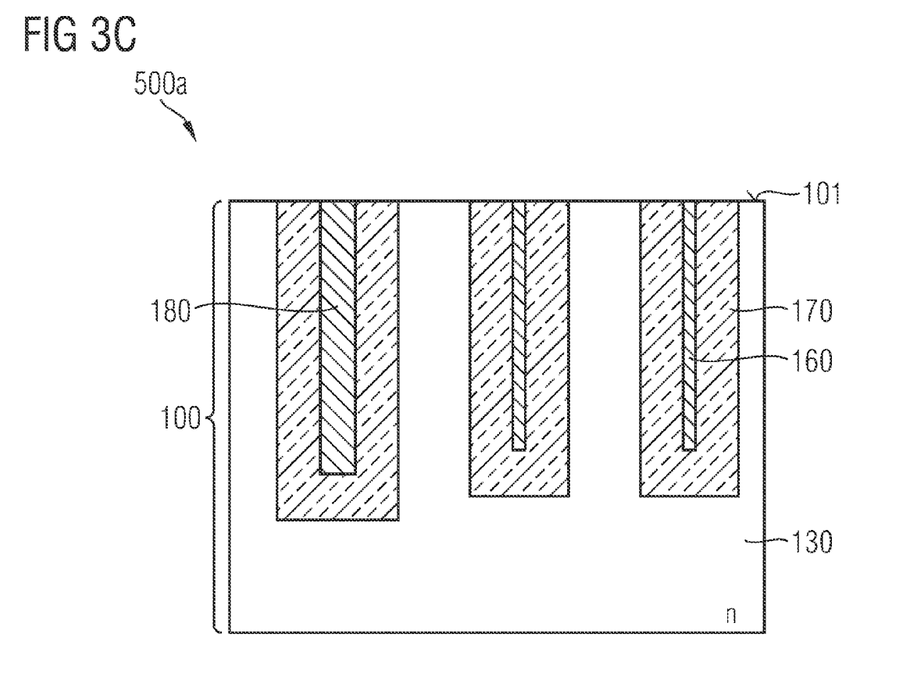
FIG. 3C is a schematic cross-sectional view of the semiconductor substrate of FIG. 3B after re-exposing and planarizing the semiconductor die.

FIG. 3C illustrates the semiconductor substrate 500a after planarizing, wherein the exposed surfaces of the field electrodes 160, 180 and the semiconductor die 100 are flush with each other. An etch mask 710 is provided and patterned by photolithographic processes such that openings 712 in the etch mask 710 in the cell area 610 expose outer portions of the trench insulation structures 170 directly adjoining portions of the semiconductor die 100 between neighboring trench structures. The outer portions may extend from the vertical edge between the semiconductor die 100 and the concerned trench insulation structure 170 up to at least 200 nm, for example about 350 nm, into a direction of the corresponding field electrode 160, the vertical edge extending orthogonal to the first surface 101. The etch mask 710 covers the field electrodes 160 and further portions of the trench insulation structures 170 directly adjoining the field electrodes 160 in the cell areas 610. In the edge areas 690 no openings 712 are formed. The etch mask 710 may cover the complete edge area 690.

Figure 3D:
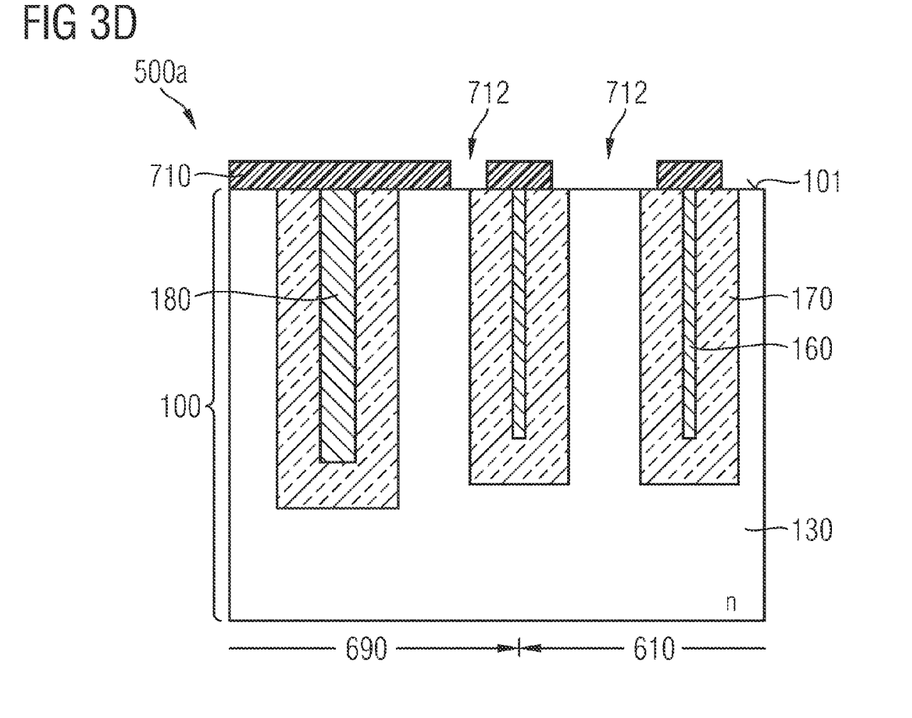
FIG. 3D is a schematic cross-sectional view of the semiconductor substrate of FIG. 3C after providing an etch mask.

According to FIG. 3D the etch mask 710 covers the edge area 690, the field electrodes 160 and central portions of the trench insulation structures 170 directly adjoining the field electrodes 160. The material of the etch mask 710 may be a photo resist. Openings 712 expose outer portions of the trench insulation structures 170 directly adjoining portions of the semiconductor die 100 between neighboring trench structures. Using the etch mask 710 the material of the trench insulator structures 170 is selectively etched against the semiconductor die 100 up to a depth of several 100 nanometer, for example more than 200 nanometer.

Figure 3E:
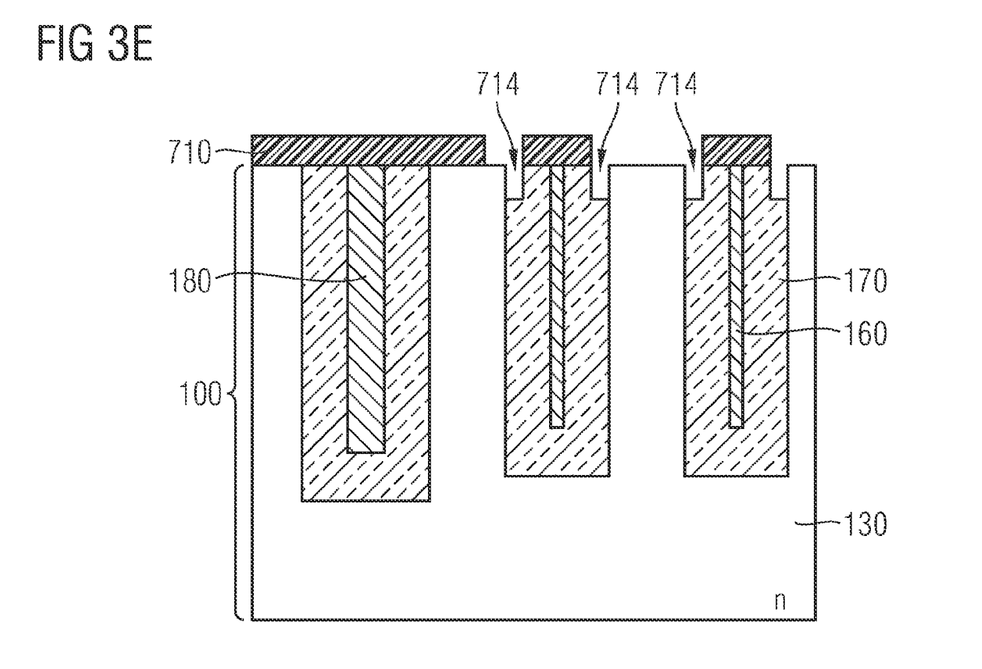
FIG. 3E is a schematic cross-sectional view of the semiconductor substrate of FIG. 3D after etching pockets for gate electrodes.

FIG. 3E shows pockets 714 resulting from the anisotropic etch of the trench insulation structures 170 selectively to the semiconductor die 100. With regard to the first surface 101 the pockets 714 may have a depth of 600 nanometer, by way of example. After forming the pockets 714, the etch mask 710 is removed and a gate dielectric is provided, for example by depositing a suitable dielectric material or by thermally growing an oxide of the material of the semiconductor die 100, for example silicon oxide. The remaining pockets are than filled with a conductive material which is then removed from outside the pockets 714, for example by a planarization process like chemical mechanical polishing.

Figure 3F:
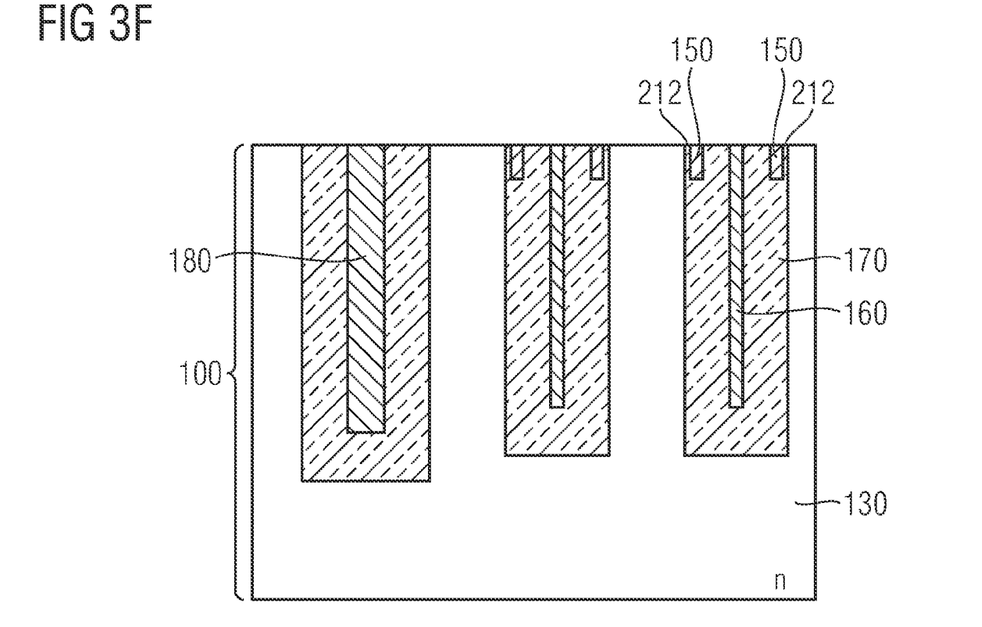
FIG. 3F is a schematic cross-sectional view of the semiconductor substrate of FIG. 3E after providing gate electrodes.

FIG. 3F shows gate electrodes 150 resulting from the deposited conductive material and gate dielectrics 212 insulating the gate electrodes 150 from the semiconductor die 100. The conductive material may be highly doped polycrystalline silicon. According to another embodiment, the gate electrodes 150 consist of or include one or more metal structures, e.g. a titanium nitride TiN layer and a tungsten W fill. A stray oxide may be formed on the first surface 101 and a first implant mask 720 may be provided that covers the edge area 690.

Figure 3G:
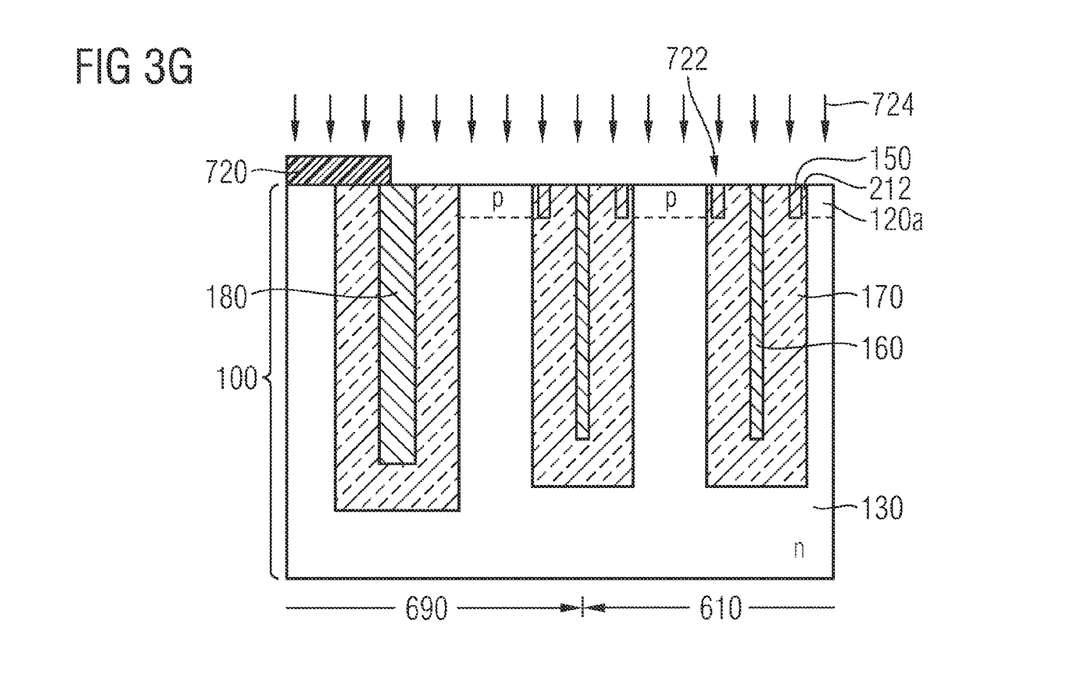
FIG. 3G is a schematic cross-sectional view of the semiconductor substrate of FIG. 3F during formation of body wells.

As shown in FIG. 3G the first implant mask 720 may cover the semiconductor die 100 at least in portions of the edge area 690. Openings 722 expose at least the cell area 610 of the semiconductor die 100. Impurities of the second conductivity type 724 are introduced into the exposed portions of the semiconductor die 100 and tempered to form body wells 120*a*. The body wells 120*a* directly adjoin the first surface 101. In the finalized semiconductor device, a buried edge of the body wells 120*a* and the buried edges of the gate electrodes 150 may have approximately the same distance to the first surface 101. The impurities of the second conductivity type 724 may be introduced by using an implant process. The first implant mask 720 may be removed and a further auxiliary layer may be deposited and patterned by photolithographic means to form a second implant mask 730.

Figure 3H:
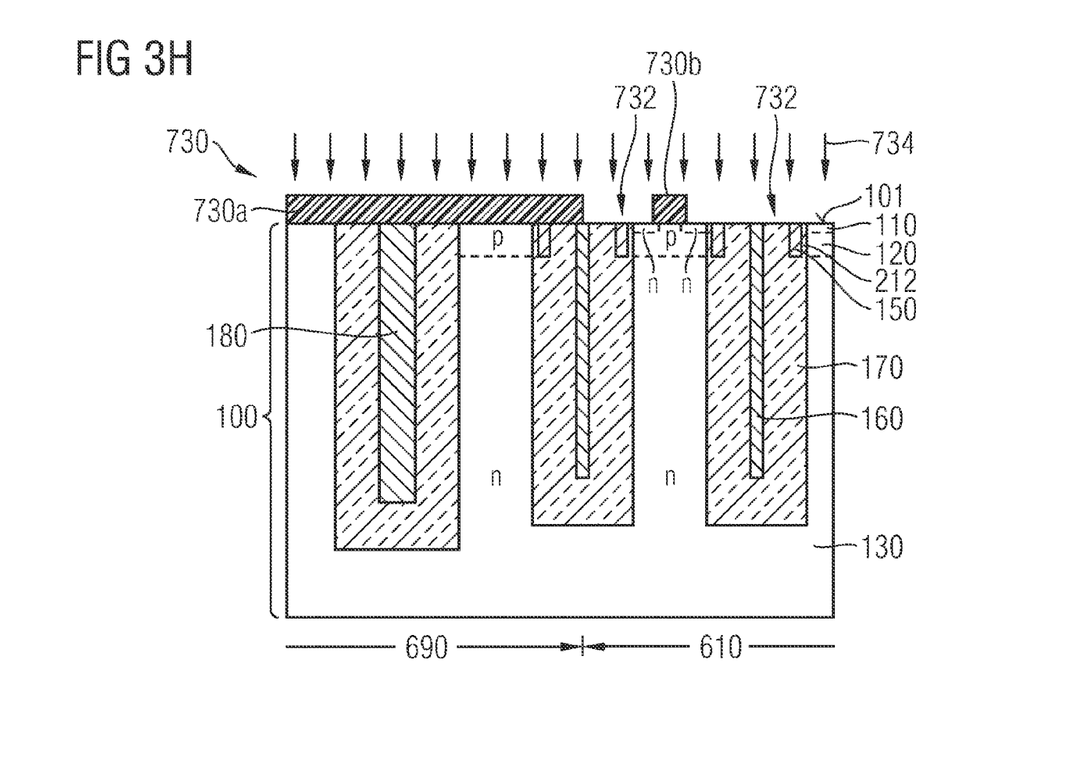
FIG. 3H is a schematic cross-sectional view of the semiconductor substrate of FIG. 3G during formation of source zones.

FIG. 3H shows the second implant mask 730 with first portions 730*a* covering, in the edge area 690, at least the exposed surfaces of the semiconductor die 100. Second portions 730*b* of the second implant mask 730 cover central portions of the exposed surfaces of the semiconductor die 100. The second portions 730*b* may have approximately equal distances to both neighboring gate electrodes 150. In the cell area 610 openings 732 of the second implant mask 730 expose at least outer portions of body wells 120*a* oriented to the gate electrodes 150. The openings 732 may further expose the gate electrodes 150 and the field electrodes 160 in the cell area 610.

The second implant mask 730 is used to form source zones 110 of the first conductivity type in the body wells 120*a* of the second conductivity type as shown in FIG. 3G. The second portions 730*b* of the second implant mask 730 inhibit impurities of the first conductivity type from impinging into the shielded portions of the body wells 120*a* such that the body zones 120 emerging from the body wells 120*a* include extension portions directly adjoining the first surface 101 respectively. One or more dielectric material(s) may be provided on the first surface 101 and patterned by photolithographic means.

Figure 3I:
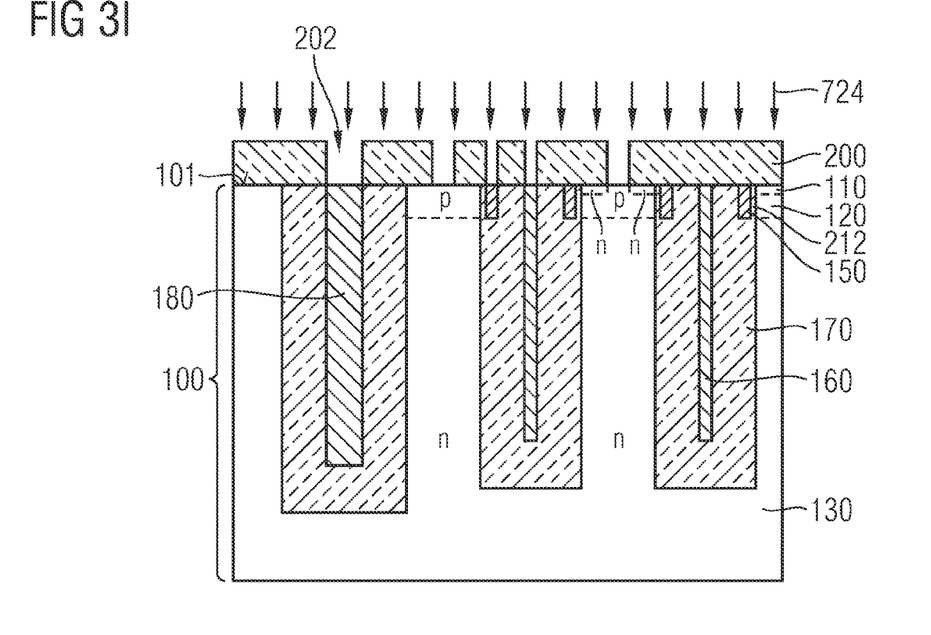
FIG. 3I is a schematic cross-sectional view of the semiconductor substrate of FIG. 3H after providing openings in a dielectric layer disposed on the semiconductor die.

FIG. 3I shows a dielectric layer 200 formed directly on the first surface 101 from the provided dielectric material(s). Providing the dielectric layer 200 may include sequential deposition of two or more sub-layers. For example, a silicon oxynitride sub-layer may be formed at least in portions of the first surface 101 where the semiconductor die 100, the field electrodes 160, 180 or the gate electrodes 150 are exposed. A further dielectric sub-layer may be provided that is effective as an adhesive layer, for example USG (undoped silicate glass). A main dielectric layer may be provided from doped silicate glass, e.g. BSG, PSG or BPSG. The thickness of the dielectric layer 200 in total may range from 500 nm to 5000 nm, for example from 1000 nm to 2000 nm.

The dielectric layer 200 may be patterned in total by photolithographic means such that openings 202 in the dielectric layer 200 expose at least the body zones 120 in the cell area 610. According to other embodiments, in the edge area 690, one or more of the body wells 120*a* and the field electrodes 150, 180 are exposed. Introducing impurities of the second conductivity type 724 in the body wells 120*a* and in the body zones 120 forms highly doped body contact regions 121 for reducing the contact resistance to contact plugs provided later in the process.

A metal silicide 310, for example titanium silicide, tantalum silicide or tungsten silicide may be formed on portions of the semiconductor die 100 and on further conductive structures exposed by the openings 202 in the dielectric layer 200. Polycrystalline silicon may be deposited to form polysilicon plugs 320 filling the openings 202. An impurity layer containing at least one metallic recombination element may be deposited and annealed. For example, a platinum layer may be deposited and annealed to form platinum containing structures 330 on the exposed surfaces of the polysilicon plugs 320.

Figure 3J:
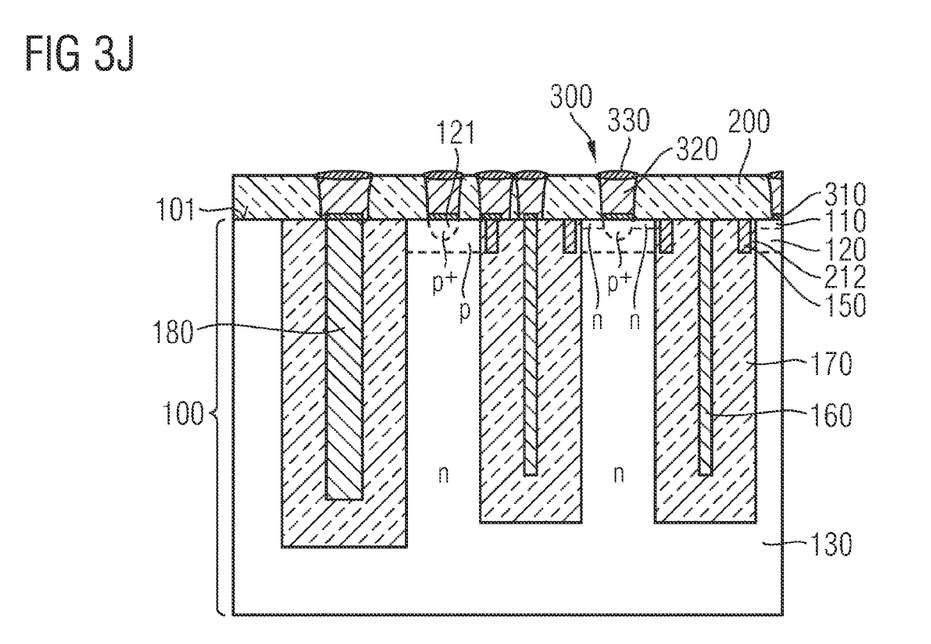
FIG. 3J is a schematic cross-sectional view of the semiconductor substrate of FIG. 3I after providing contact plugs with platinum silicide structures.

FIG. 3J shows contact plugs 300 with the platinum containing structures 330 formed on polysilicon plugs 320 extending through the dielectric layer 200. Metal silicide 310 extends along the interfaces between the polysilicon plugs 320 and the semiconductor die 100. The semiconductor substrate 500*a* may be tempered at temperatures of at least 750 degree Celsius to diffuse platinum Pt out from the platinum containing structures 330 into the semiconductor die 100 to reduce the reverse recovery charge.

Figure 4:
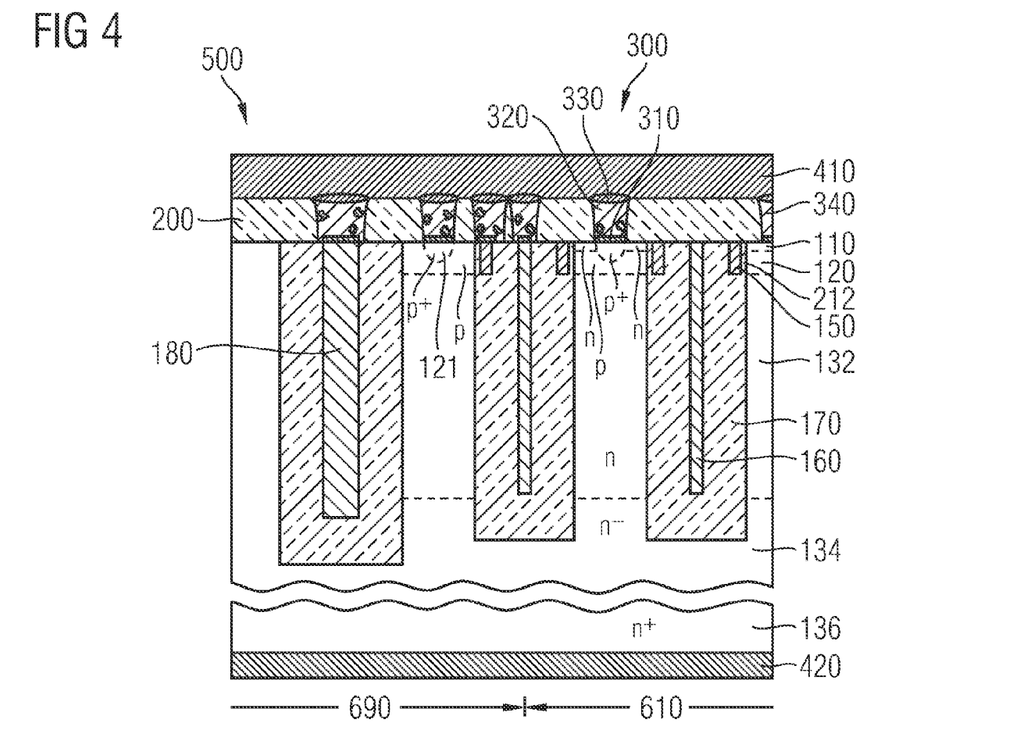
FIG. 4 is a schematic cross-sectional view of a semiconductor device according to an embodiment related to body zones adjoining a first surface of a semiconductor die.

FIG. 4 illustrates a semiconductor device 500 which may result, by way of example from the method as described with reference to FIGS. 3A to 3J. FIG. 4 includes all elements of FIG. 3J. In addition, FIG. 4 shows a first metal layer 410 electrically connected to the source zones 110 and the body zones 120 in the cell area 610 through contact plugs 300. According to some embodiments, the first metal layer 410 is also electrically connected to the body wells 120*a* and further conductive structures in the edge area 690. The contact plugs 300 include silicide crystallites 340, for example platinum silicide crystallites resulting from the out diffusion of platinum atoms from a platinum containing structure provided at a distance to the first surface 101.

The doped layer 130 may include a highly doped substrate layer 136, a low-doped drift layer 134 and a compensation layer 132, which may be portions of an epitaxial layer and which have an impurity concentration higher than the drift layer 134. A second metal layer 420 directly contacts the substrate layer 136. The first and second metal layers 410, 420 may consist of or contain, as main constituent(s), aluminum Al, copper Cu or alloys of aluminum or copper, for example AlSi, AlCu, or AlSiCu. According to other embodiments, the first and/or second metal layer 410, 420 may contain, as main constituent(s) nickel Ni, titanium Ti, silver Ag, gold Au, platinum Pt and/or palladium Pd. Each of the first and second metal layers 410, 420 may include two or more sub-layers of the mentioned composition.

Again, platinum silicide is not formed directly on the monocrystalline semiconductor die 100 such that platinum silicide is neither formed close to the channel region nor in the contact regions of the source zones 110 and the body zones 120. The on-state characteristics of the semiconductor device 500 are not strongly affected by platinum silicide. On the other hand, atoms of a metallic recombination element such as platinum Pt, which are diffused out from an impurity source provided at a distance to the semiconductor die 100 effectively reduce the reverse recovery charge.

Figure 5:
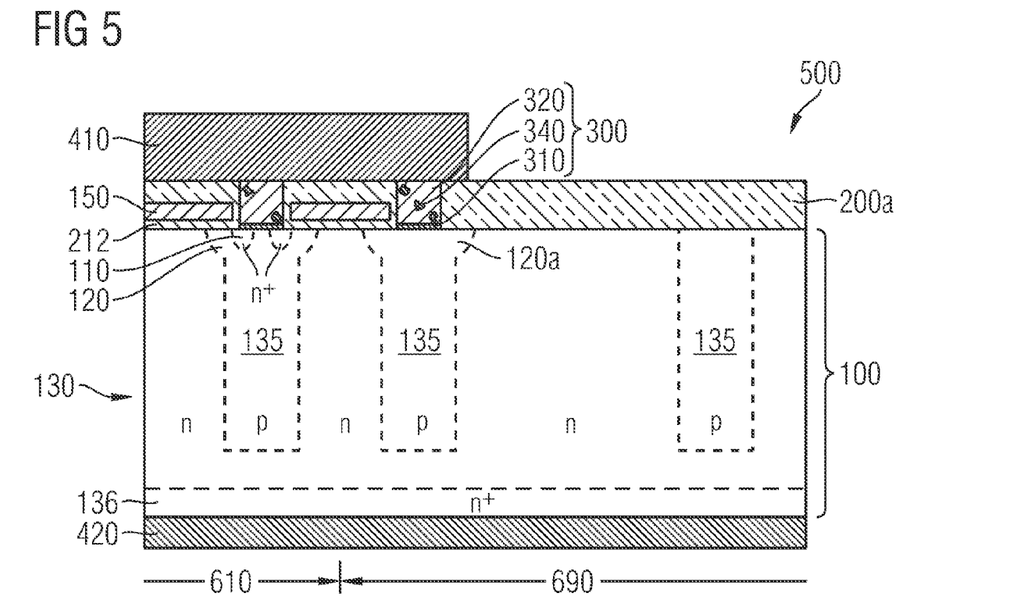
FIG. 5 is a schematic cross-sectional view of a portion of a super-junction semiconductor device including doped compensation structures in accordance with a further embodiment.

FIG. 5 refers to an embodiment related to a super-junction semiconductor device 500. In a cell area 610 of a semiconductor die 100, columnar structures extending in a vertical direction orthogonal to the first and second surfaces 101, 102 of the semiconductor die 100 are alternately arranged. For example, in the case of an n-FET, a high impurity concentration in the n-doped columns result in a low on-state resistance of the semiconductor device 500. On the other hand, when a reverse voltage is applied, depletion zones extend between the n-doped columns and the p-doped columns 135 in a lateral direction parallel to the first and second surfaces 101, 102 such that a high reverse breakdown voltage can be achieved despite the high impurity concentration in the n-doped columns.

According to the illustrated embodiment referring to n-FETs, p-doped body zones 120 may be formed as vertical extensions or as portions of the p-type columns 135 adjoining the first surface 101. The source zones 110 may be formed as wells within body wells 120a. Remaining sections of the body wells 120a form the body zones 120. Gate electrodes 150 are disposed outside the semiconductor die 100 at a distance to the first surface 101. Gate dielectrics 212 separate the gate electrodes 150 from the semiconductor die 100 and the body zones 120 formed within the semiconductor die 100. A dielectric structure 200a insulates the gate electrodes 150 from a first metal layer 410 and from contact plugs 300 electrically connecting the first metal layer 410 with the body zones 120 and the source zones 110 in the semiconductor die 100. A second metal layer 420 directly contacts a substrate layer 136 of the doped layer 130.

The contact plugs 300 may include metal silicide 310 at the interface to the semiconductor die 100, a polysilicon plug 320 and platinum semiconductor crystallites 340, e.g. platinum silicide crystallites 340, resulting from the out diffusion of platinum atoms from a platinum containing structure provided at a distance to the semiconductor die 100.

Figure 6:
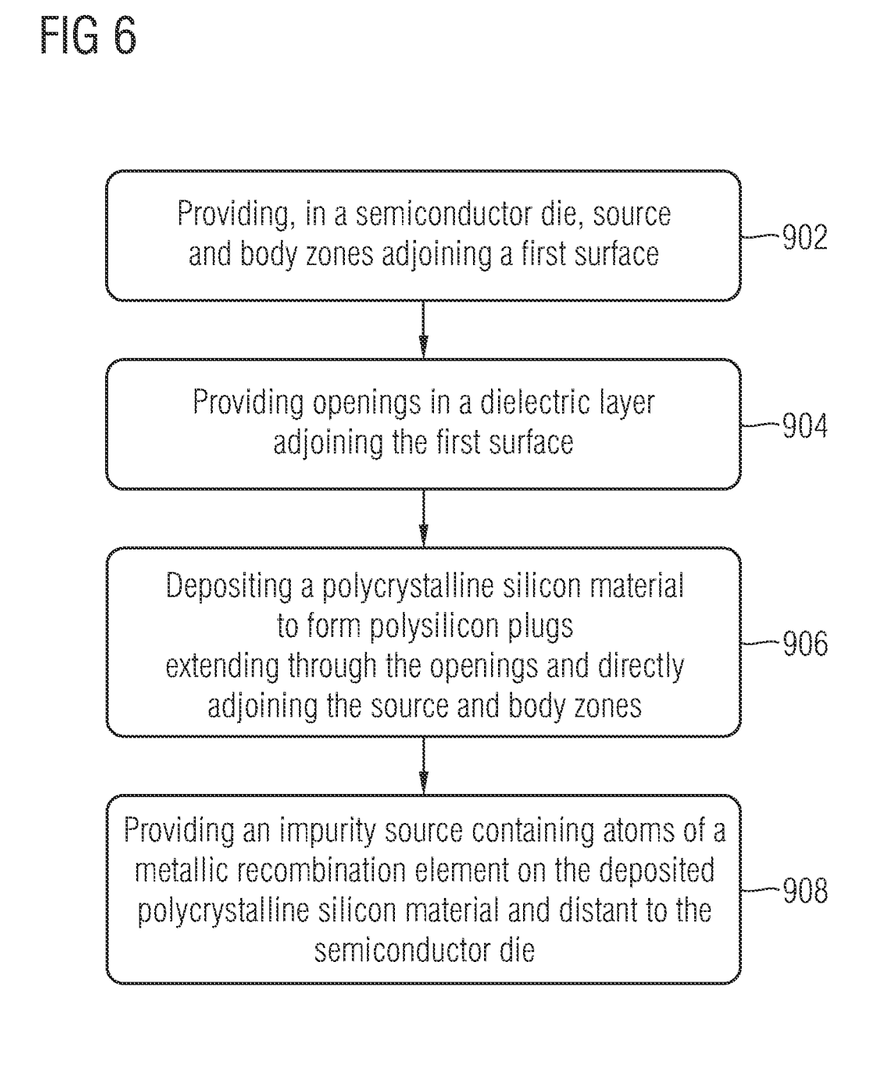
FIG. 6 is a simplified flow-chart of a method of manufacturing a semiconductor device according to another embodiment.

FIG. 6 refers to a method of manufacturing a semiconductor device. In a semiconductor die, source zones of a first conductivity type and body zones of a second conductivity type are provided, wherein the second conductivity type is the opposite of the first conductivity type and wherein the source zones directly adjoin a first surface of the semiconductor die (902). Openings are formed in a dielectric layer that adjoins the first surface (904). A polycrystalline silicon material is deposited to form polysilicon plugs extending through the dielectric layer and being electrically connected to the source and the body zones (906). An impurity source containing a metallic recombination element is provided in contact with the deposited polycrystalline silicon material and distant to the semiconductor die (908).

According to an embodiment the impurity source is tempered to diffuse atoms of the metallic recombination element, e.g. platinum Pt, iridium Ir, Vanadium V, palladium Pd, or gold Au, out from the impurity source into the semiconductor die to reduce charge carrier lifetime in the semiconductor die.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   providing source zones of a first conductivity type and body zones of a second conductivity type, which is the opposite of the first conductivity type, in a semiconductor die, the source zones adjoining a first surface of the semiconductor body;
   depositing a polycrystalline silicon material to form polysilicon plugs extending through openings in a dielectric layer adjoining the first surface, the polysilicon plugs being electrically connected to the source and the body zones; and
   providing an impurity source in contact with the deposited polycrystalline silicon material and distant to the first surface of the semiconductor die, the impurity source containing atoms of a metallic recombination element, and
   tempering the impurity source to diffuse atoms of the metallic recombination element from the impurity source through the polysilicon plugs into the semiconductor die such that the polysilicon plugs are not formed completely from silicide, wherein in the polysilicon plugs silicide crystallites are formed from the atoms of the metallic recombination element.

2. The method of claim 1, wherein the metallic recombination element is selected from a group comprising platinum, palladium, vanadium, iridium and gold.

3. The method of claim 1, wherein the metallic recombination element is platinum and the impurity source is a platinum source.

4. The method of claim 3, wherein platinum silicide crystallites are formed in the polysilicon plugs during the tempering to diffuse platinum atoms from the platinum source into the semiconductor die.

5. The method of claim 1, further comprising providing trench structures extending from the first surface into the semiconductor die, the trench structures comprising, in a cell area of the semiconductor die, gate electrodes separated by gate dielectrics from the semiconductor die.

6. The method of claim 1, further comprising providing, in the semiconductor die, a drift layer between the body zones and a second surface of the semiconductor die, wherein the second surface is opposite to the first surface and the drift layer is of the first conductivity type.

7. The method of claim 1, further comprising providing, in the semiconductor die, a drift layer between the body zones and a second surface of the semiconductor die, wherein the second surface is opposite to the first surface and the drift layer is formed to comprise first columns of the first conductivity type and second columns of the second conductivity type, the first and second columns being alternatingly arranged and extending in a vertical direction orthogonal to the first surface.

8. The method of claim 3, wherein providing the platinum source comprises bringing a platinum containing solution in contact with the deposited polycrystalline silicon material.

9. The method of claim 3, wherein providing the platinum source comprises providing platinum containing structures on the deposited polycrystalline silicon material.

10. The method of claim 9, wherein providing the platinum containing structures comprises:
   depositing a platinum layer on exposed surfaces of the semiconductor material;
   tempering the platinum layer to selectively form, from the deposited platinum layer, layered platinum silicide structures on the exposed surfaces of the semiconductor material; and
   removing non-silicided portions of the platinum layer.

11. The method of claim 10, further comprising removing the layered platinum silicide structures after tempering so that platinum atoms diffuse out from the layered platinum silicide structures into the semiconductor die.

12. The method of claim 9, wherein providing the platinum containing structures comprises depositing at most five atomic platinum layers on the deposited polycrystalline silicon material.

13. The method of claim 9, wherein providing the platinum containing structures comprises implanting platinum atoms or ions into the deposited polycrystalline silicon material.

14. The method of claim 1, wherein providing the source and the body zones comprises forming the body zones and forming the source zones between the first surface and the body zones, and wherein providing the polysilicon plugs comprises etching contact trenches extending from the first surface up to at least interfaces between the body zones and the source zones.

15. The method of claim 1, wherein providing the source and the body zones comprises forming the body zones and forming the source zones adjoining the first surface, the body zones comprising extension sections adjoining the first surface, respectively.

* * * * *